(12) United States Patent
Kim

(10) Patent No.: US 11,160,348 B2
(45) Date of Patent: Nov. 2, 2021

(54) ARTIFICIAL NAIL AND PRODUCTION EQUIPMENT EMPLOYING 3D PRINTING TECHNIQUE FOR UV LED CURING

(71) Applicant: BIO MEDICAL 3D PRINTING CO., LTD., Seoul (KR)

(72) Inventor: Nam Soo Kim, Seoul (KR)

(73) Assignee: BIO MEDICAL 3D PRINTING CO., LTD., Seoul (KR)

( * ) Notice: Subject to any disclaimer, the term of this patent is extended or adjusted under 35 U.S.C. 154(b) by 385 days.

(21) Appl. No.: 16/328,672

(22) PCT Filed: Nov. 15, 2016

(86) PCT No.: PCT/KR2016/013133
§ 371 (c)(1),
(2) Date: Feb. 26, 2019

(87) PCT Pub. No.: WO2018/043818
PCT Pub. Date: Mar. 8, 2018

(65) Prior Publication Data
US 2019/0183227 A1 Jun. 20, 2019

(30) Foreign Application Priority Data
Aug. 30, 2016 (KR) .................. 10-2016-0110877

(51) Int. Cl.
*A61Q 3/02* (2006.01)
*B29C 71/04* (2006.01)
(Continued)

(52) U.S. Cl.
CPC ............. *A45D 31/00* (2013.01); *A45D 29/00* (2013.01); *B29C 64/106* (2017.08);
(Continued)

(58) Field of Classification Search
CPC ............. A44C 15/0075; A44C 15/008; A45D 31/00; A61Q 3/02; B29C 2035/0827;
(Continued)

(56) References Cited

U.S. PATENT DOCUMENTS

| 4,708,866 | A | * | 11/1987 | Turco | ................. A61Q 3/00 |
| | | | | | 424/61 |
| 5,045,601 | A | * | 9/1991 | Capelli | ................ C08G 18/671 |
| | | | | | 525/327.1 |
| 6,548,566 | B1 | * | 4/2003 | Huebener | ............. C08G 59/62 |
| | | | | | 156/275.5 X |

(Continued)

FOREIGN PATENT DOCUMENTS

| JP | H05293955 A | 11/1993 |
| JP | H06155729 A | 6/1994 |

(Continued)

OTHER PUBLICATIONS

Translation of KR 20160049195 A (published on May 9, 2016).*

(Continued)

*Primary Examiner* — Leo B Tentoni
(74) *Attorney, Agent, or Firm* — Barcelo, Harrison & Walker, LLP

(57) ABSTRACT

Methods and devices for producing artificial nails are disclosed, comprising: automatically recognizing user nail information by means of a 3D scanner (S100); recognizing a selected nail decoration design of a 2D or 3D form by means of a UV 3D printer (S200); a step in which the UV 3D printer, equipped with a device capable of adjusting a Z axis, forms a decoration layer corresponding to a curved surface of a user's nail shape with the nail decoration design recognized in step S200, on the basis of the user nail information recognized in step S100 (S300); a step in which the UV 3D printer forms an adhesive layer to be attached with the decoration layer produced in step S300; and a step (Continued)

of completely curing the decoration layer and the adhesive layer in a short time by subjecting same to heat treatment by using a UV lamp of the UV 3D printer, thereby printing an artificial nail in which the adhesive layer is coupled to the bottom of the decoration layer.

9 Claims, 8 Drawing Sheets

(51) Int. Cl.
| | |
|---|---|
| *A45D 31/00* | (2006.01) |
| *B33Y 80/00* | (2015.01) |
| *B33Y 70/00* | (2020.01) |
| *B29C 67/00* | (2017.01) |
| *C09D 11/03* | (2014.01) |
| *G06F 30/00* | (2020.01) |
| *B33Y 50/02* | (2015.01) |
| *B33Y 50/00* | (2015.01) |
| *B33Y 40/20* | (2020.01) |
| *B29C 65/14* | (2006.01) |
| *B29C 64/106* | (2017.01) |
| *B29C 64/112* | (2017.01) |
| *B29C 65/48* | (2006.01) |
| *C09D 11/101* | (2014.01) |
| *G01B 11/24* | (2006.01) |
| *B29C 64/393* | (2017.01) |
| *A45D 29/00* | (2006.01) |
| *G06K 19/07* | (2006.01) |
| *H04B 5/00* | (2006.01) |
| *G06K 19/077* | (2006.01) |
| *A44C 15/00* | (2006.01) |
| *B29K 73/00* | (2006.01) |
| *B29C 35/08* | (2006.01) |
| *B33Y 10/00* | (2015.01) |
| *B29L 31/00* | (2006.01) |

(52) U.S. Cl.
CPC .......... *B29C 64/112* (2017.08); *B29C 64/393* (2017.08); *B29C 65/1406* (2013.01); *B29C 65/4845* (2013.01); *B29C 67/00* (2013.01); *B33Y 40/20* (2020.01); *B33Y 50/00* (2014.12); *B33Y 50/02* (2014.12); *B33Y 70/00* (2014.12); *B33Y 80/00* (2014.12); *C09D 11/03* (2013.01); *C09D 11/101* (2013.01); *G01B 11/24* (2013.01); *G06F 30/00* (2020.01); *G06K 19/0723* (2013.01); *A44C 15/008* (2013.01); *A44C 15/0075* (2013.01); *B29C 2035/0827* (2013.01); *B29K 2073/00* (2013.01); *B29L 2031/718* (2013.01); *B33Y 10/00* (2014.12); *G06K 19/0776* (2013.01); *G06K 19/07745* (2013.01); *G06K 19/07762* (2013.01); *H04B 5/0056* (2013.01); *H04B 5/0062* (2013.01)

(58) Field of Classification Search
CPC ................. B29C 64/106; B29C 64/112; B29C 64/386; B29C 64/393; B29C 65/1406; B29C 65/4845; B29C 71/04; B29K 2073/00; B29L 2031/718; B33Y 10/00; B33Y 40/20; B33Y 50/00; B33Y 50/02; C09D 11/101; G06K 19/0723; G06K 19/07745; G06K 19/0776; G06K 19/07762; H04B 5/0056; H04B 5/0062
USPC ...... 264/129, 255, 308, 331.11, 331.21, 494, 264/496; 156/275.5, 275.7, 327, 328; 132/200; 340/572.1, 572.8, 572.9; 424/61; 455/41.1; 523/105
See application file for complete search history.

(56) References Cited

U.S. PATENT DOCUMENTS

| | | | | |
|---|---|---|---|---|
| 2003/0073753 | A1* | 4/2003 | Lilley | A61Q 3/02 522/18 |
| 2006/0054039 | A1* | 3/2006 | Kritchman | B33Y 10/00 101/424.1 |
| 2011/0256079 | A1* | 10/2011 | Kozachek | A45D 31/00 424/61 |
| 2015/0076732 | A1* | 3/2015 | Kemmer | B29C 64/106 264/255 |
| 2015/0213352 | A1* | 7/2015 | Niedermann | G06K 19/0723 132/73 |
| 2015/0342320 | A1* | 12/2015 | Watanabe | A45D 31/00 424/61 |
| 2017/0021566 | A1* | 1/2017 | Lund | B29C 64/106 |

FOREIGN PATENT DOCUMENTS

| | | |
|---|---|---|
| JP | H07299902 A | 11/1995 |
| KR | 10-1997-0033721 | 7/1997 |
| KR | 10-0317845 B1 | 1/2002 |
| KR | 10-2005-0003635 A | 1/2005 |
| KR | 10-1087655 B1 | 12/2011 |
| KR | 10-2014-0146740 A | 12/2014 |
| KR | 10-2015-0115027 A | 10/2015 |
| KR | 10-2016-0049195 A | 5/2016 |
| WO | 9033372 A1 | 7/1999 |

OTHER PUBLICATIONS

Korean Patent Abstract (in English) of KR Patent App. Pub. No. 10-20150115027 A, Pub. Date Oct. 14, 2015, downloaded Feb. 19, 2019 from http:///worldwide.espacenet.com/.
Korean Patent Abstract (in English) of KR Patent App. Pub. No. 10-19970033721, Pub. Date Jul. 22, 1997.
Korean Patent Abstract (in English) of KR Patent App. Pub. No. 10-19970033721, Pub. Date Jul. 22, 1997, downloaded Feb. 19, 2019 from http://engpat.kipris.or.kr/engpat/biblioa.do.
Korean Patent Abstract (in English) of KR Patent Pub. No. 10-20050003635 A, Pub. Date Jan. 12, 2005, downloaded Feb. 19, 2019 from http:///worldwide.espacenet.com/ .
Korean Patent Abstract (in English) of KR Patent Pub. No. 10-20160049195 A, Pub. Date May 9, 2016, downloaded Feb. 19, 2019 from http:///worldwide.espacenet.com/.
Korean Patent Abstract (in English) of KR Patent Pub. No. 10-20140146740 A, Pub. Date Dec. 29, 2014, downloaded Feb. 19, 2019 from http:///worldwide.espacenet.com/.
Korean Patent Abstract (in English) of KR Patent App. Reg. No. 10-0317845 B1, Reg. Date Dec. 5, 2001, Pub. Date Jan. 18, 2002, downloaded Feb. 28, 2019 from http://engpat.kipris.or.kr/engpat/biblioa.do.
Korean Patent Abstract (in English) of WO Int'l Unex. Pub. No. 9933372 A1, Int'l Unex. Pub. Date Jul. 8, 1999.
Korean Patent Abstract (in English) of KR Patent Pub. No. 10-1087655 B1, Pub. Date Dec. 9, 2011, downloaded Feb. 28, 2019 from http://worldwide.espacenet.com/.
International Search Report (in Korean) of WO Int'l Unex. Pub. No. 9933372 A1 (PCT/JP98/05538), Int'l Unex. Pub. Pub. Date Jul. 8, 1999.
Japanese Patent Abstract (in English) of JP Patent Pub. No. H07299902 A, Pub. Date Nov. 14, 1995, downloaded Mar. 11, 2019 from http://worldwide.espacenet.com/.
Japanese Patent Abstract (in English) of JP Patent Pub. No. H06155729 A, Pub. Date Jun. 3, 1994, downloaded Mar. 11, 2019 from http://worldwide.espacenet.com/.

(56) References Cited

OTHER PUBLICATIONS

Japanese Patent Abstract (in English) of JP Patent Pub. No. H07299902 A, Pub. Date Nov. 9, 1993, downloaded Mar. 11, 2019 from http://worldwide.espacenet.com/.

* cited by examiner

ARTIFICIAL NAIL AND PRODUCTION EQUIPMENT EMPLOYING 3D PRINTING TECHNIQUE FOR UV LED CURING

CROSS-REFERENCE TO RELATED APPLICATIONS

This application is the national stage for International Patent Cooperation Treaty Application PCT/KR2016/013133, filed Nov. 15, 2016, which claims priority from Korean Patent Application No. 10-2016-0110877, filed Aug. 30, 2016, in the Korean Intellectual Property Office. The entire contents of said applications are incorporated herein by reference for all purposes.

BACKGROUND OF THE INVENTION

Technical Field

The present invention relates to an artificial nail and production equipment, and more particularly, to a method and equipment for producing an artificial nail by using 3D printing techniques for UV-LED curing.

People who are particular about how they look tend to focus on bodily parts, such as the aesthetic appearance, and this interest has reached the fingertips. Just as skin care is regularly received, nails are also constantly cared for, and this interest is growing rapidly, attracting attention not only to women but also to men, so it is not uncommon to see male customers in the nail shop.

When a person goes to a nail shop for treatment, it takes a procedure of a complicated design to put color on nails and decorate the nail with parts, so that lots of cost and time are taken, thereby requiring substantial time and material investment. Further, a manicure treatment has various problems incurable during a treatment process, and for example, hazardous substances, such as formaldehyde, toluene, dibutyl phthalate, contained in a manicure material have harmful effects when exposed to the respiratory organs during a treatment process, and toxic substances contained in an adhesive used during the treatment may also infect the nail and cause various side effects.

Korean Patent No. 10-0317845 (Jan. 18, 2002), which is a prior art document, discloses a method and a device for producing an artificial nail, in which a nail surface of a user is supported to a holder of a finger, one or more artificial nail pictures among artificial nail pictures stored in a computer are selected, ink is injected from a nozzle unit under the control of the computer while moving one of or both the nozzle unit and the finger holder to print a selected printing pattern on the nail surface, thereby automatically printing the desired artificial nail picture on the nail surface. As mentioned in this prior art document, when the nail art is directly performed on the nail, the foregoing problems may be generated.

The existing general manicure has a problem in that hardening speed is very slow and the manicure peels shortly. In order to supplement the problem, a gel nail is developed, but there are still disadvantages in that a design form is changed and a peeling phenomenon continues like the general manicure.

In order to overcome these limitations, a scheme of printing and attaching a desired design onto a nail by means of UV ink appears, and this solves costly problems in the nail shop, shortens the time, and has the effect of increasing the duration period of time of artificial nails. The existing gel nail also employs a method of hardening a gel nail on a nail by using a UV lamp, but direct exposure of the skin to UV rays may accelerate skin aging and even seriously cause skin cancer.

Korean Patent No. 10-1087655 (Dec. 9, 2011) and Korean Patent Application Laid-Open No. 10-2016-0049195 (May 9, 2016), which are prior art documents, disclose nail stickers or a method of producing an artificial nail for solving the problems.

Korean Patent No. 10-1087655 (Dec. 9, 2011) has the problems in that a nail sticker can be produced only in the form of a planar sticker, and relatively harmful ingredients are used as the ingredients of an adhesive in an attachment scheme.

Korean Patent Application Laid-Open No. 10-2016-0049195 (May 9, 2016) presents a method of producing an artificial nail by using a 3D printer, but does not disclose a particular method of producing an artificial shape, and has a problem in that substance ingredients used in an adhesive and an adhesive layer are relatively harmful like the foregoing prior art document.

In order to address all of the foregoing problems, the present invention discloses a method of producing an artificial nail having a 2D/3D shape by using a device which is capable of adjusting a Z-axis at an external side without being directly exposed to a body, a method of attaching an artificial nail by using an adhesion ingredient minimizing damage to the nail, and a device for producing an artificial nail.

DISCLOSURE

Technical Problem

An object of the present invention is to provide an artificial nail, which has a flexible structure according to a shape of a nail, and implements a design which a user wants with a 2D planar color or in a 3D form by using an adhesion material and an adhesive containing an ingredient replenishing nails with nutrition.

Technical Solution

In order to solve the technical problem, the present invention provides a device 100 which is provided within a 3D printer and is capable of adjusting a Z-axis, in which a nail tip support 110, a lower plate 120, and a rack 140 for supporting the nail tip support 110 are integrally coupled, a rack gear guide 130 for protecting the rack 140 is installed, the rack 140 is embedded within the rack gear guide 130, a stepper motor 160 and a motor bracket 170 holding up the stepper motor 160 are integrally coupled to be fixed on the lower plate 120, the stepper motor 160 is connected with a pinion 150 through a rotation shaft to rotate the pinion 150, and the rack 140 and the pinion 150 are installed while being engaged with each other and the pinion 150 rotates and the rack 140 vertically moves, so that the nail tip support 110 vertically moves.

In order to solve another technical problem, the present invention provides a method of producing an artificial nail, the method including: automatically recognizing nail information of a user through a 3D scanner (S100); recognizing a 2D or 3D nail decoration design through a UV 3D printer (S200); forming, by the UV 3D printer including a device 100 which is capable of adjusting a Z-axis, a decoration layer 220 according to a curved surface of a nail form of the user by using the nail decoration design recognized in operation S200, on the basis of the nail information of the user recognized in operation S100 (S300); forming, by the UV 3D printer, an adhesive layer 240 to be attached to the decoration layer 220 produced in operation S300 (S400); and completely hardening the decoration layer 220 and the adhesive layer 240 in a short time by performing a heat treatment on the decoration layer 220 and the adhesive layer 240 through a UV lamp of the UV 3D printer to print an artificial nail, in which the adhesive layer 240 is coupled to a lower portion of the decoration layer 220 (S500).

In addition, a thickness of the artificial nail may be adjusted by the device 100 which is capable of adjusting the Z-axis.

In addition, the adjustable thickness may be 5 to 500 microns.

In addition, in operation S200, the nail decoration design may be recognized by using a graphic file and be printed in multiple layers to implement a 3D shape.

In addition, an ink ingredient of the UV 3D printer may contain a solution, in which oily $TiO_2$ and oily polymer are mixed.

In addition, an ink ingredient of the UV 3D printer may contain a solution, in which aqueous vitamin and aqueous collagen are mixed.

In addition, operations S200, S300, and S400 are not directly performed on a nail of a user, but may be performed through printing outside.

In addition, the adhesive layer 240 may contain an oily polycaprolactone (PCL) ingredient.

In addition, the adhesive layer 240 may contain aqueous vitamin and aqueous collagen ingredients.

In addition, a Near Field Communication (NFC) chip may be embedded between the decoration layer 220 and the adhesive layer 240 of the artificial nail produced by the method.

In addition, the decoration layer 220 produced in operation S300 may be attached to the nail by using an adhesive 300 containing a PCL ingredient.

In addition, the adhesive 300 may additionally contain one or more ingredients among aqueous chitosan, aqueous hyaluronic acid, aqueous vitamin, and an aqueous laminate material.

In addition, the method may include applying etchant gel onto the nail as a previous operation of the attachment of the artificial nail.

Advantageous Effects

Through the technical solution, according to the present invention, it is possible to print various kinds of desired designs during printing once without an additional setting process by storing a mold having a nail shape in a program during printing, and nail health is protected by using an adhesion method of preventing the coloration and peeling of a nail. The adhesive 300 contains hyaluronic acid, chitosan, and the like of an aqueous ingredient, as well as PCL, to be adhered, thereby providing an artificial nail enabling beauty care and nail care at one time.

BRIEF DESCRIPTION OF THE DRAWINGS

The accompanying drawings included as a part of the detailed description for helping the understanding of the present invention provide an exemplary embodiment of the present invention and describe the technical spirit of the present invention together with the detailed description.

DETAILED DESCRIPTION

Best Mode

Figure 4:
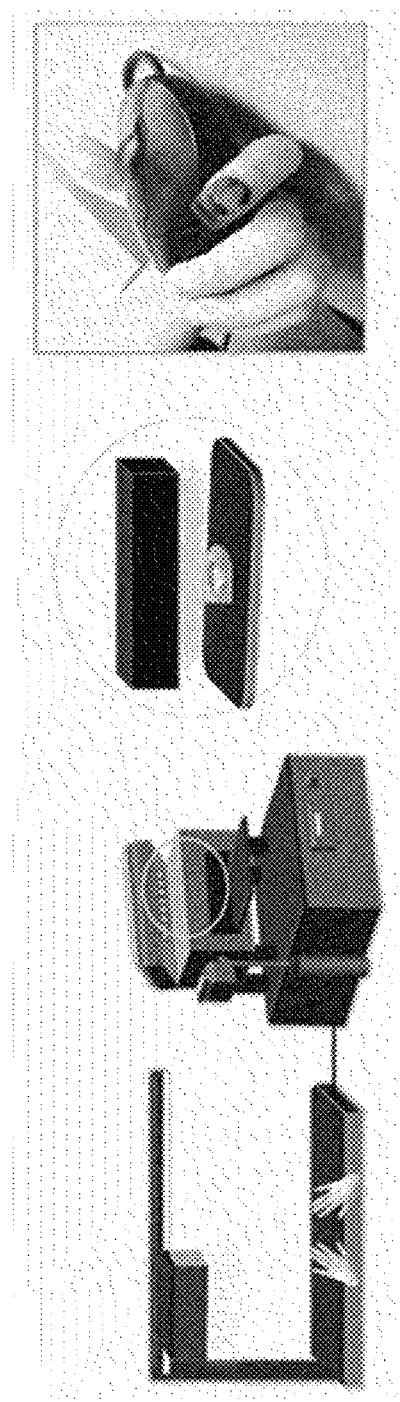
FIG. 4 is a picture illustrating a process of producing an artificial nail according to an exemplary embodiment of the present invention.
Figure 5:
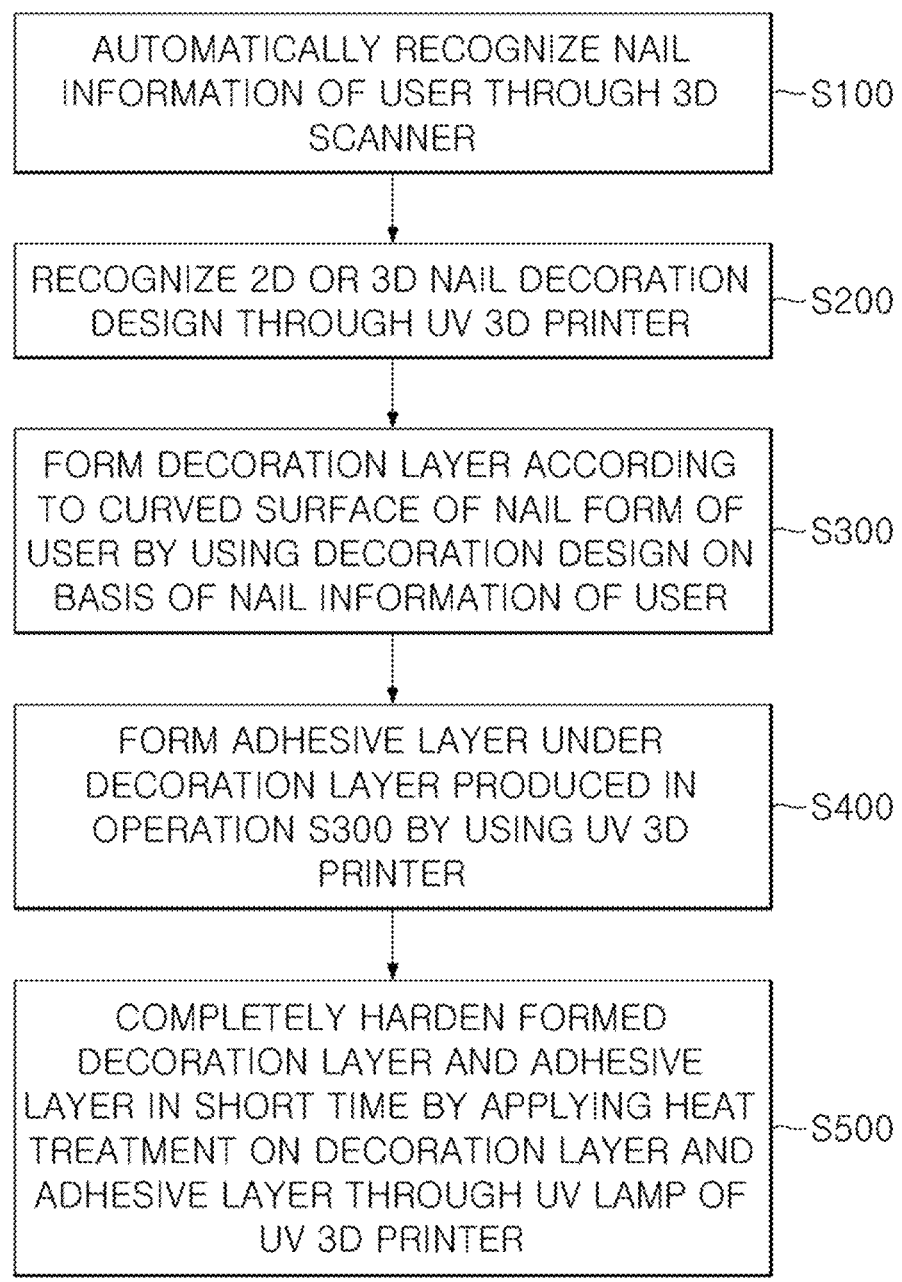
FIG. 5 is a flowchart illustrating the process of producing an artificial nail according to an exemplary embodiment of the present invention.

FIG. 4 is a picture illustrating a process of producing an artificial nail according to an exemplary embodiment of the present invention, and FIG. 5 is a flowchart illustrating the process of producing an artificial nail according to an exemplary embodiment of the present invention.

Referring to FIG. 4, in order to acquire nail information (for example, a size, a shape, and a degree of bending of a nail) of a user, nail information of a user is input through an automation system of a 3D scanner or a 3D printer. The input nail information of the user is transmitted to the 3D printer, and the 3D printer prints the nail information to provide a user customized artificial nail.

To describe in detail with reference to FIG. 5, the process of producing an artificial nail includes automatically recognizing nail information of a user through a 3D scanner (S100); recognizing a 2D or 3D nail decoration design through a UV 3D printer (S200); forming, by the UV 3D printer including the device 100 which is capable of adjusting the Z-axis, a decoration layer 220 according to a curved surface of the nail form of the user by using the nail decoration design recognized in operation S200, on the basis of the nail information of the user recognized in operation S100 (S300); forming, by the UV 3D printer, an adhesive layer 240 on a lower portion of the decoration layer 220 produced in operation S300 (S400); and completely hardening the formed decoration layer 220 and adhesive layer 240 in a short time by performing a heat treatment on the formed decoration layer 220 and adhesive layer 240 through a UV lamp of the UV 3D printer (S500).

The method is a printing method, not handwork, so that the method may clearly implement a design form of a customer and colors. Further, when an artificial nail is produced and attached by the printing method, not handwork, it is possible to prevent a nail from being damaged during a nail art treatment process and a skin disease generated due to the long-time exposure to UV rays, and a small frame shaped like a nail is used on a printing plate, so that it is possible to print various kinds of nail designs by printing at one time.

Mode for Carrying Out the Invention

Terms or words used in the present specification and the claims shall not be interpreted to be limited as general or lexical meanings, and on the principle that the inventor can appropriately define a concept of a term for describing the invention by the best method, the terms or the words shall be interpreted as a meaning and a concept corresponding to the technical spirit of the present invention. Accordingly, exemplary embodiments described in the present specification and the configuration illustrated in the drawing are simply the exemplary embodiments of the present invention, and do not represent all of the technical spirits of the present invention, and thus it should be understood that there are various equivalents and modification examples substitutable with the exemplary embodiments described in the present specification and the configuration illustrated in the drawing at the time of filing the present invention. Hereinafter, a method and a device for producing an artificial nail according to an exemplary embodiment of the present invention will be described in detail with reference to the accompanying drawings.

Figure 1:
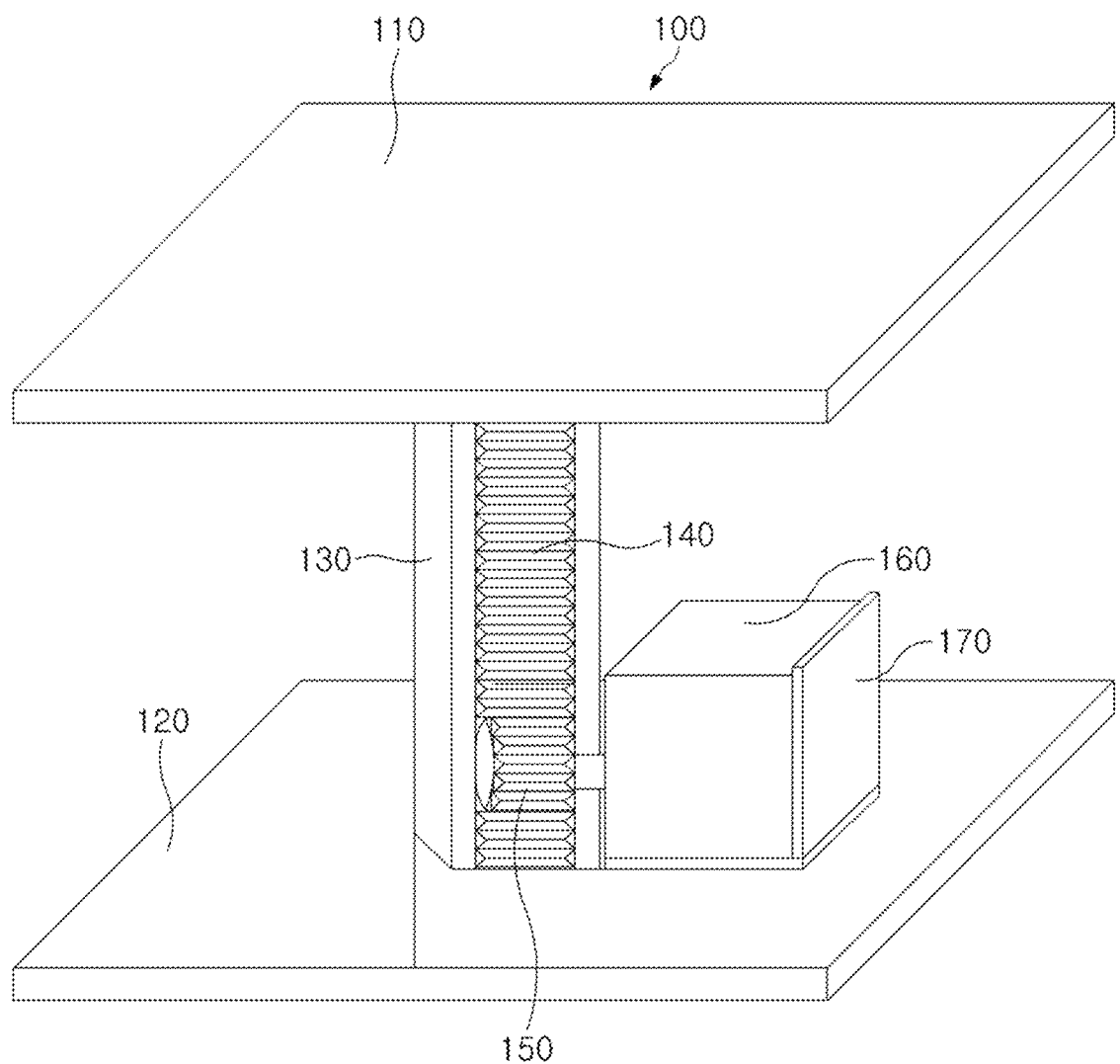
FIG. 1 is a perspective conceptual diagram illustrating a device 100 which is capable of adjusting a Z-axis according to an exemplary embodiment of the present invention.

FIG. 1 is a perspective conceptual diagram illustrating a device 100 which is capable of adjusting a Z-axis according to an exemplary embodiment of the present invention.

Referring to FIG. 1, the device 100 which is capable of adjusting a Z-axis is provided within a 3D printer, and in the device 100, a nail tip support 110, a lower plate 120, and a rack 140 for supporting the nail tip support 110 are integrally coupled, a rack gear guide 130 for protecting the rack 140 is installed, the rack 140 is embedded within the rack gear guide 130, a stepper motor 160 and a motor bracket 170 holding up the stepper motor 160 are integrally coupled to be fixed on the lower plate 120, the stepper motor 160 is connected with a pinion 150 through a rotation shaft to rotate the pinion 150, and the rack 140 and the pinion 150 are installed while being engaged with each other and the pinion 150 rotates and the rack 140 vertically moves, so that the nail tip support 110 vertically moves.

An operation process of the device 100 which is capable of adjusting a Z-axis will be described. First, when the pinion 150 is rotated by power of the stepper motor 160 and the rack 140 vertically moves by the rotation of the pinion 150, the connected nail tip support 110 vertically moves by the vertical movement of the rack 140, thereby adjusting a Z-axis (vertical adjustment). By providing the device 100 which is capable of adjusting a Z-axis on a printing plate of existing equipment, it is possible to produce a decoration layer with multiple layers, thereby producing an artificial nail having a 3D shape. An entire thickness of the artificial nail may be adjusted up to a micron unit by using the device 100 which is capable of adjusting a Z-axis.

Figure 2A:
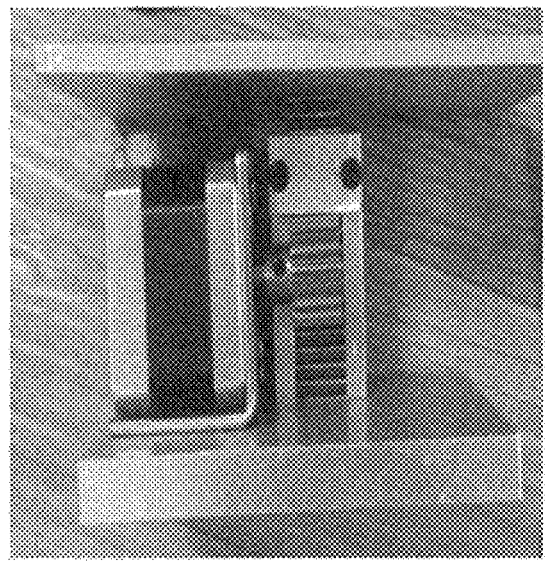
FIG. 2A and FIG. 2B are actual pictures of the device 100 which is capable of adjusting a Z-axis according to an exemplary embodiment of the present invention.
Figure 2B:
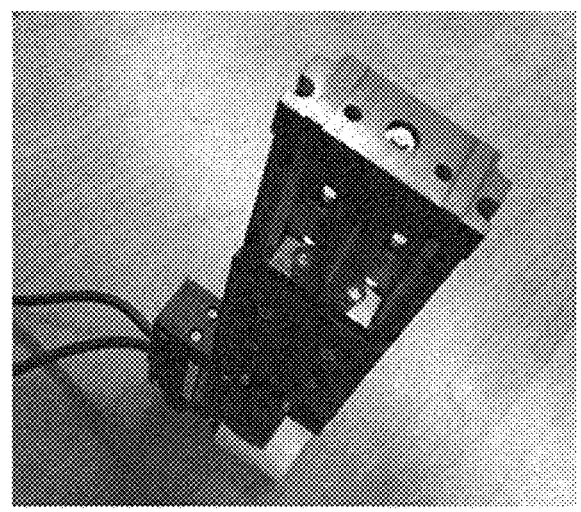

FIG. 2A and FIG. 2B are actual pictures of the device 100 which is capable of adjusting a Z-axis according to an exemplary embodiment of the present invention.

Figure 3:
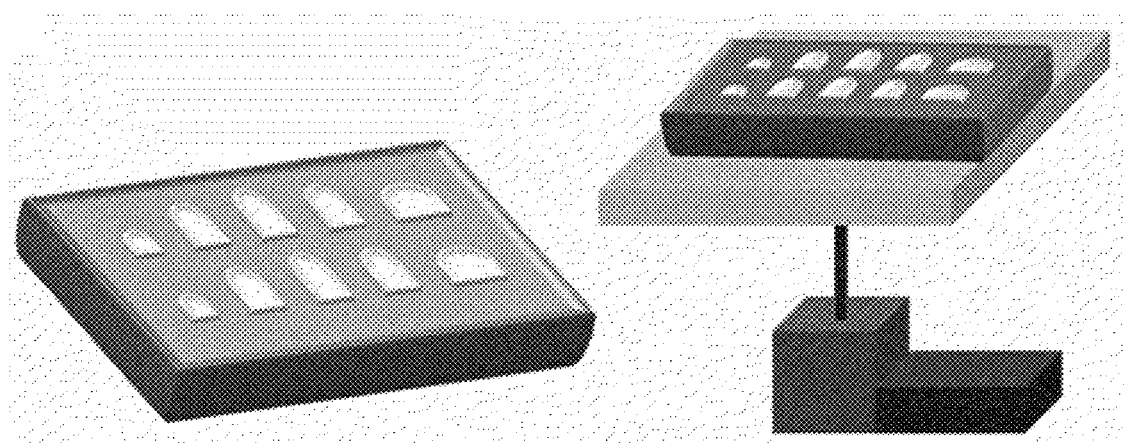
FIG. 3 is a schematic diagram illustrating the device 100 which is capable of adjusting a Z-axis and a mold according to an exemplary embodiment of the present invention.

FIG. 3 is a schematic diagram illustrating the device 100 which is capable of adjusting a Z-axis and a mold according to an exemplary embodiment of the present invention. In FIG. 3, it can be seen that a standardized mold is laid on the nail tip support 110 of the device 100 which is capable of adjusting a Z-axis. The mold is formed by continuously collecting nail information of a user and standardizing the collected nail information, and it is possible to produce a standardized and customized artificial nail according to a demand of a user rapidly, variously, and in quantity through the mold.

FIG. 4 is a picture illustrating a process of producing an artificial nail according to an exemplary embodiment of the present invention, and FIG. 5 is a flowchart illustrating the process of producing an artificial nail according to an exemplary embodiment of the present invention.

Referring to FIG. 4, in order to acquire nail information (for example, a size, a shape, and a degree of bending of a nail) of a user, nail information of a user is input through an automation system of a 3D scanner or a 3D printer. The input nail information of the user is transmitted to the 3D printer, and the 3D printer prints the nail information to provide a user customized artificial nail.

To describe in detail with reference to FIG. 5, the process of producing an artificial nail includes automatically recognizing nail information of a user through a 3D scanner (S100); recognizing a 2D or 3D nail decoration design through a UV 3D printer (S200); forming, by the UV 3D printer including the device 100 which is capable of adjusting the Z-axis, a decoration layer 220 according to a curved surface of the nail form of the user by using the nail decoration design recognized in operation S200, on the basis of the nail information of the user recognized in operation S100 (S300); forming, by the UV 3D printer, an adhesive layer 240 on a lower portion of the decoration layer 220 produced in operation S300 (S400); and completely hardening the formed decoration layer 220 and adhesive layer 240 in a short time by performing a heat treatment on the formed decoration layer 220 and adhesive layer 240 through a UV lamp of the UV 3D printer (S500).

The method is a printing method, not manual work, so that the method may clearly implement a design form and colors preferred by a customer. Further, when an artificial nail is produced and attached by the printing method, not manual work, it is possible to prevent a nail from being damaged during a nail art treatment process and skin disease generated due to the long-time exposure to UV rays, and a small frame shaped like a nail is used on a printing plate, so that it is possible to print various kinds of nail designs by printing at one time.

Figure 6:
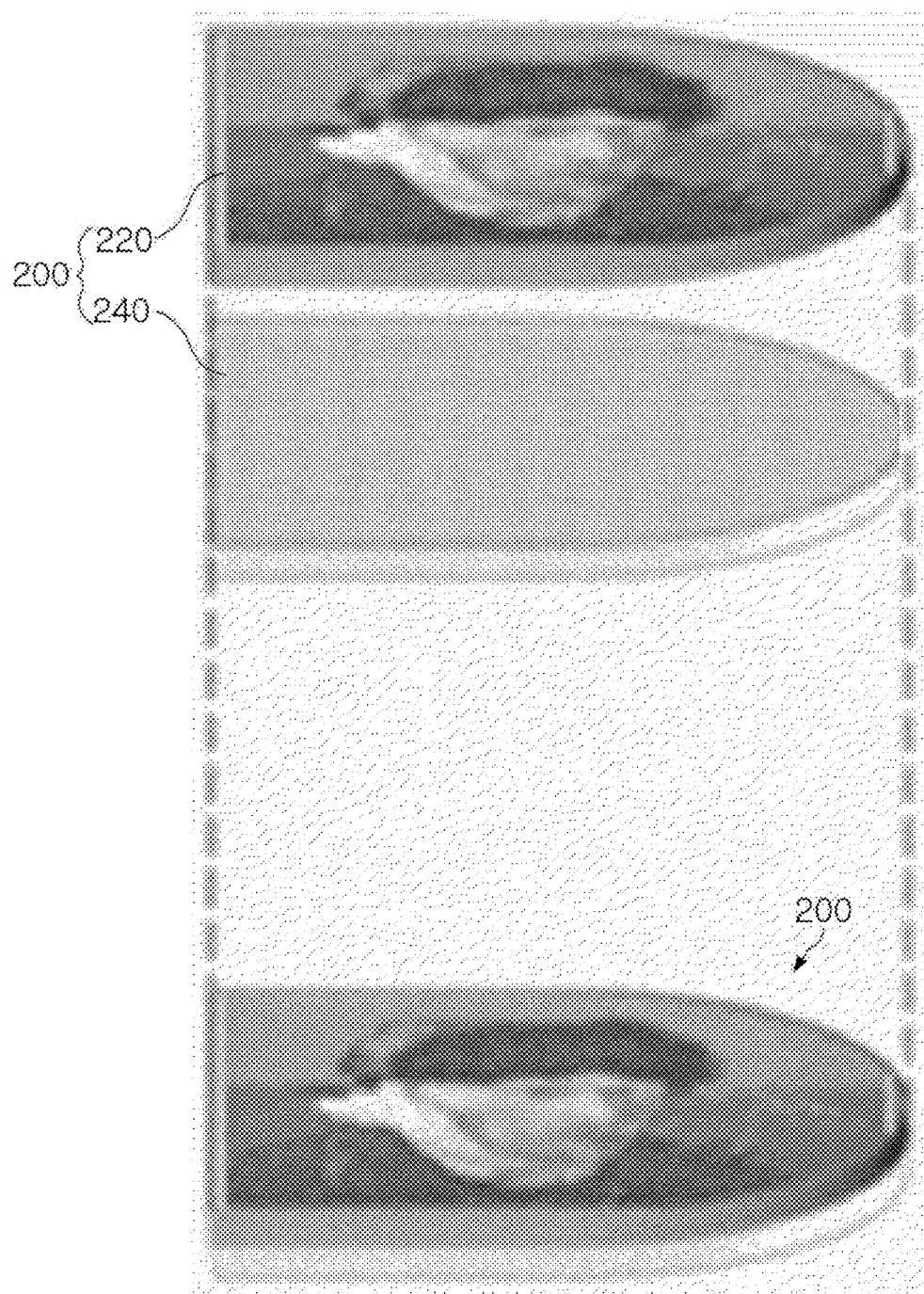
FIG. 6 is a schematic diagram of an artificial nail 200 according to an exemplary embodiment of the present invention.

FIG. 6 is a schematic diagram of an artificial nail according to an exemplary embodiment of the present invention.

The artificial nail produced by the method of FIG. 1 presented as the exemplary embodiment of the present invention includes a nail decoration layer 220 coated with a user desired design, and an adhesive layer 240 which helps the artificial nail to be easily attached to the nail.

The decoration layer 220 is formed of ink materials containing aqueous or oily ingredients used in the UV 3D printer as main ingredients, and includes a user desired design. The adhesive layer 240 helps the artificial nail to be attached to the nail of the user, and may use an ingredient formed of vitamin and collagen or polycaprolactone (PCL). As an exemplary embodiment, the vitamin may be vitamin B2.

The produced artificial nail may be directly attached to a nail of a user without a separate adhesive after being produced. The material used in the adhesive layer 240 contains less irritant materials, such as vitamin and collagen of an aqueous ingredient to minimize damage to the nail.

In the meantime, a Near Field Communication (NFC) chip may be embedded between the decoration layer 220 and the adhesive layer 240 in the artificial nail of the present invention, and the NFC chip may emit light and exhibit an effect of a lighting device.

As an exemplary embodiment of the present invention, the decoration layer 220 may be printed in multiple layers to represent a 3D shape by the device 100 which is capable of adjusting a Z-axis. Particularly, a picture which a user wants to use as a decoration is implemented in a 3D shape by recognizing information, such as shade, color, and shadow, through a computer program, and the 3D shape is printed in multiple layers through a 3D printer equipped with the device 100 which is capable of adjusting a Z-axis, thereby forming the decoration layer 220 in three dimensions. As an exemplary embodiment, when the number of layers is five or more, the 3D form may be more clearly represented.

Figure 7:
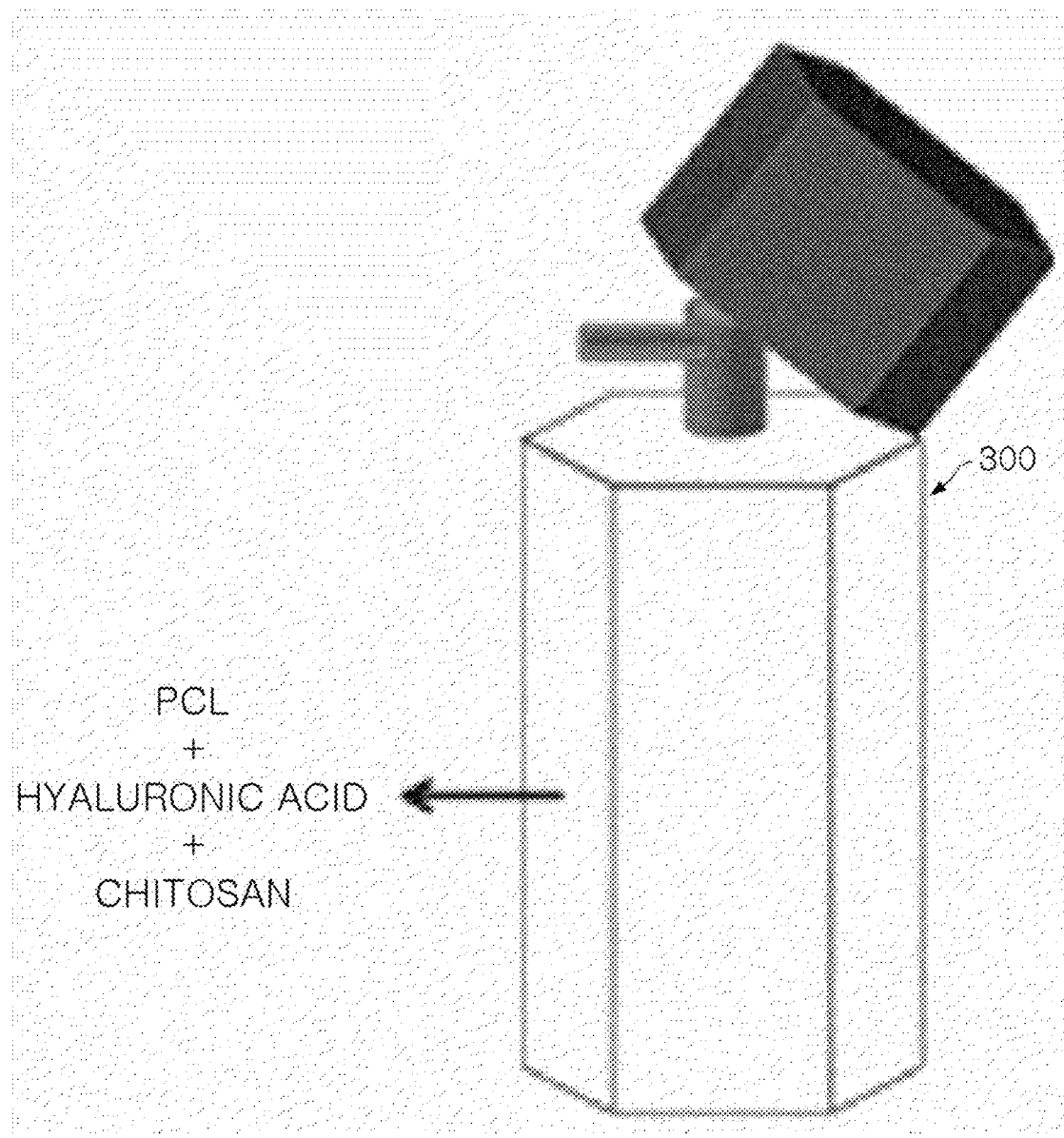
FIG. 7 is a schematic diagram of an adhesive 300 according to an exemplary embodiment of the present invention.

FIG. 7 is a schematic diagram of the adhesive 300 according to an exemplary embodiment of the present invention.

According to the present invention, the method of attaching the artificial nail includes a method of directly attaching the artificial nail formed of the decoration layer 220 and the adhesive layer 240 to a nail as described above, and a method of printing the decoration layer 220, applying the adhesive 300 under the decoration layer 220, and attaching the decoration layer 220 to a nail.

The adhesive layer 300 basically contains a PCL ingredient which is less irritant to a nail and is used for a medical purpose as a main ingredient, and in this case, the adhesive 300 may additionally include hyaluronic acid, chitosan, and the like which are functional materials good for the skin and be used, and the use of the adhesive 300 may alleviate the irritation and replenish the weakened nail with nutrition. Herein, the PCL is an oily ingredient, and the vitamin and the collagen are aqueous ingredients.

The two methods of attaching the artificial nail include an operation of applying etchant gel onto the nail as a previous operation, thereby helping the artificial nail to be easily attached to the nail.

Figure 8:
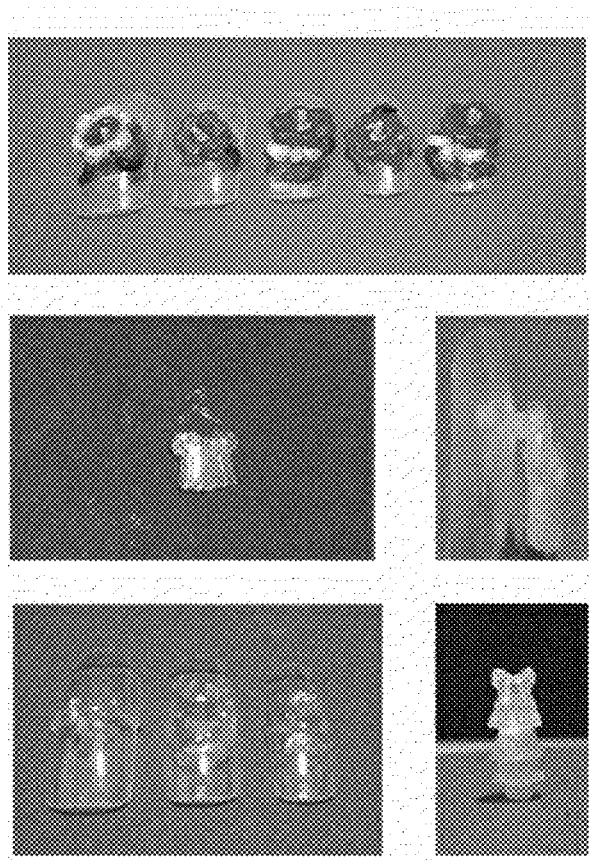
FIG. 8 is a picture illustrating an artificial nail produced according to an exemplary embodiment of the present invention.
Figure 8:
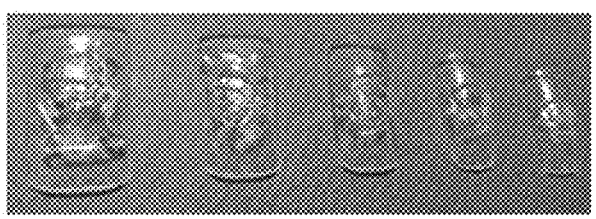
Figure 8:
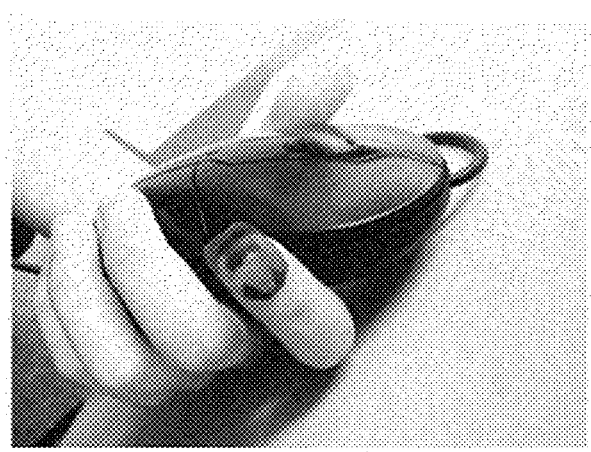

FIG. 8 is a picture illustrating an artificial nail produced according to an exemplary embodiment of the present invention.

Through the present invention, as illustrated in FIG. 8, it is possible to produce an artificial nail having various 3D shapes.

In the foregoing, representative exemplary embodiments of the present invention have been described in detail, but those skilled in the art may understand that various modifications are possible within a limit without departing from the range of the present invention. Therefore, the scope of the present invention shall not be limited to the described embodiments and defined by the limited embodiments, but shall be defined in equivalents of the claims, as well as the claims to be described later.

What is claimed is:

1. A method of producing an artificial nail, the method comprising:
   automatically recognizing nail information of a user through a 3D scanner (S100);
   recognizing a 2D or 3D nail decoration design through a UV 3D printer (S200);
   forming, by the UV 3D printer including a device which is capable of adjusting a Z-axis, a decoration layer according to a curved surface of a nail form of the user by using the nail decoration design recognized in operation S200, on the basis of the nail information of the user recognized in operation S100 (S300);
   forming, by the UV 3D printer, an adhesive layer on a lower portion of the decoration layer produced in operation S300 (S400); and
   completely hardening the formed decoration layer and adhesive layer in a short time by performing a heat treatment on the formed decoration layer and adhesive layer through a UV lamp of the UV 3D printer (S500),
   wherein the device is equipped within the UV 3D printer and is capable of adjusting the Z-axis, the device comprising:
   a nail tip support, a lower plate, and a rack for supporting the nail tip support which are integrally coupled;
   a rack gear guide for protecting the rack, wherein the rack is embedded within the rack gear guide;
   a stepper motor and a motor bracket holding up the stepper motor which are integrally coupled to be fixed on the lower plate; and
   a pinion connected with the stepper motor through a rotation shaft to rotate the pinion, wherein the rack and the pinion are installed while being engaged with each other and the pinion rotates and the rack vertically moves to make the nail tip support vertically move,
   wherein the device is for producing the decoration layer with multiple layers to form the artificial nail having a 3D shape,
   wherein an ink ingredient of the UV 3D printer contains a solution, in which oily TiO2, oily polymer, aqueous vitamin and aqueous collagen are mixed, and
   wherein the adhesive layer contains an oily polycaprolactone (PCL) ingredient aqueous vitamin and aqueous collagen ingredients.

2. The method of claim 1, wherein a thickness of the artificial nail is adjusted by the device capable of adjusting the Z-axis.

3. The method of claim 2, wherein the adjustable thickness is 5 to 500 microns.

4. The method of claim 1, wherein in operation S200, the nail decoration design is recognized by using a graphic file and is printed in multiple layers to implement a 3D shape.

5. The method of claim 1, wherein operations S200, S300, and S400 are not directly performed on a nail of a user, but are performed through printing outside.

6. An artificial nail, in which a Near Field Communication (NFC) chip is embedded between the decoration layer and the adhesive layer of the artificial nail produced by the method of claim 1.

7. The method of claim 1, wherein the decoration layer produced in operation S300 is attached to the nail by using an adhesive containing a PCL ingredient.

8. The method of claim 7, wherein the adhesive additionally contains one or more ingredients among aqueous chitosan, aqueous hyaluronic acid, aqueous vitamin, and an aqueous laminate material.

9. The method of claim 7, comprising:
   applying etchant gel onto the nail as an operation previous to the attachment of the artificial nail.

* * * * *